(12) United States Patent
Ho et al.

(10) Patent No.: US 11,443,797 B2
(45) Date of Patent: Sep. 13, 2022

(54) NEURAL NETWORK COMPUTATION METHOD AND APPARATUS USING ADAPTIVE DATA REPRESENTATION

(71) Applicant: MACRONIX International Co., Ltd., Hsinchu (TW)

(72) Inventors: Shu-Yin Ho, Taichung (TW); Hsiang-Pang Li, Hsinchu County (TW); Yao-Wen Kang, Tainan (TW); Chun-Feng Wu, Taoyuan (TW); Yuan-Hao Chang, Taipei (TW); Tei-Wei Kuo, Taipei (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 345 days.

(21) Appl. No.: 16/798,166

(22) Filed: Feb. 21, 2020

(65) Prior Publication Data

US 2020/0312405 A1 Oct. 1, 2020

Related U.S. Application Data

(60) Provisional application No. 62/823,670, filed on Mar. 26, 2019.

(51) Int. Cl.
| | | |
|---|---|---|
| *G11C 11/54* | (2006.01) | |
| *G11C 11/4091* | (2006.01) | |
| *G06N 3/06* | (2006.01) | |
| *G06N 3/08* | (2006.01) | |
| *G06F 7/544* | (2006.01) | |
| *G11C 11/408* | (2006.01) | |
| *G11C 11/4094* | (2006.01) | |

(52) U.S. Cl.
CPC ............ *G11C 11/54* (2013.01); *G06F 7/5443* (2013.01); *G06N 3/06* (2013.01); *G06N 3/08* (2013.01); *G11C 11/4085* (2013.01); *G11C 11/4091* (2013.01); *G11C 11/4094* (2013.01); *G11C 2213/71* (2013.01)

(58) Field of Classification Search
CPC ........... G06N 3/08; G06N 3/06; G06F 7/5443
USPC ......................................................... 706/33
See application file for complete search history.

(56) References Cited

U.S. PATENT DOCUMENTS

2020/0411091 A1*  12/2020  Hwang ............... G11C 13/0069
2021/0073317 A1*  3/2021   Dazzi ...................... G11C 11/54

\* cited by examiner

*Primary Examiner* — Anthan Tran
(74) *Attorney, Agent, or Firm* — J.C. Patents

(57) ABSTRACT

A method and an apparatus for neural network computation using adaptive data representation, adapted for a processor to perform multiply-and-accumulate operations on a memory having a crossbar architecture, are provided. The memory comprises multiple input and output lines crossing each other, multiple cells respectively disposed at intersections of the input and output lines, and multiple sense amplifiers respectively connected to the output lines. In the method, an input cycle of kth bits respectively in an input data is adaptively divided into multiple sub-cycles, wherein a number of the divided sub-cycles is determined according to a value of k. The kth bits of the input data are inputted to the input lines with the sub-cycles and computation results of the output lines are sensed by the sense amplifiers. The computation results sensed in each sub-cycle are combined to obtain the output data corresponding to the kth bits of the input data.

15 Claims, 10 Drawing Sheets

NEURAL NETWORK COMPUTATION METHOD AND APPARATUS USING ADAPTIVE DATA REPRESENTATION

CROSS-REFERENCE TO RELATED APPLICATION

This application claims the priority benefit of U.S. provisional application Ser. No. 62/823,670, filed on Mar. 26, 2019. The entirety of the above-mentioned patent application is hereby incorporated by reference herein and made a part of this specification.

BACKGROUND

Field of the Disclosure

The present disclosure relates to neural network computations, and more particularly to a method and an apparatus for neural network computation using adaptive data representation.

Description of Related Art

Deep neuron networks (DNNs), compared with traditional machine learning approaches, have shown its capability to achieve higher accuracy on several domains such as image recognition and speech recognition. However, several challenges have emerged on performing DNN over the current Von-Neumann architecture. For example, the excessive data movement between processing units and off-chip memory units on performing DNN incurs the performance limitation and high power consumption.

To bridge the gap between computing and memory units, the concept of Processing-In-Memory (PIM) is widely advocated, and the crossbar accelerators with Resistive Random-Access Memory (ReRAM) are one of the most intensively-studied solutions. ReRAM, one of emerging non-volatile memories (NVMs), memorizes data by changing the resistance of cells and are proved to possess both capabilities of computing and memorizing. Specifically, crossbar accelerators perform digital DNN operations, i.e., Multiply-and-Accumulate (MAC) operations, on the analog aspect by setting different input voltages and resistance values to represent input and weight values, respectively.

For example, FIG. 1 shows an example of performing the computation of MAC operations by using a crossbar accelerator, and this example aims to calculate the result of $\Sigma(V_n \times G_n)$. In this example, each wordline is connected to each bitline by a ReRAM cell at the cross point in the 3D space. By Kirchhoff's current law (KCL), given voltages V1 and V2 to the corresponding wordlines, the emerged electric currents I1, I2, I3, I4 of each ReRAM cell induced by conductance G1, G2, G3, G4 are accumulated to currents I5 and I6 on the corresponding bitlines instantaneously. The results of the MAC operations are retrieved simultaneously by sensing currents on each bitline, where the value of I5 equals to V1×G1+V2×G2 and the value of I6 equals to V1×G3+V2×G4.

However, in practice, it is hard to program the resistance values of each ReRAM cell to represent arbitrary weight values, and thus, this programming variation issue leads to analog variation errors while converting the result from analog to digital aspects.

SUMMARY

In view of the above, the present disclosure provides a method and an apparatus for neural network computation using adaptive data representation capable of reducing the resistance converting distortion and increasing the accuracy of neural network computation.

The present disclosure provides a neural network computation method using adaptive data representation, adapted for a processor to perform multiply-and-accumulate (MAC) operations on a memory having a crossbar architecture. The memory comprises a plurality of input lines and a plurality of output lines crossing each other, a plurality of cells respectively disposed at intersections of the input lines and the output lines, and a plurality of sense amplifiers respectively connected to the output lines. In the method, an input cycle of kth bits respectively in a plurality of input data to be inputted to the input lines is adaptively divided into a plurality of sub-cycles, wherein a number of the divided sub-cycles is determined according to a value of k and k is an integer. The kth bits of the plurality of input data are inputted to the input lines with the sub-cycles and computation results of the output lines are sensed by the sense amplifiers. The computation results sensed in each sub-cycle are combined to obtain a plurality of output data corresponding to the kth bits of the input data.

In an embodiment of the disclosure, the output data corresponding to the bits of each order of the input data is multiplied with corresponding exponential base and multiplication results of the bits of all orders are summed to obtain a final output data.

In an embodiment of the disclosure, the number of the divided sub-cycles increases as the value of k increases and a maximum number of the input lines involved in each of the divided sub-cycles is determined according to a resolution of the sense amplifiers.

In an embodiment of the disclosure, the input lines are wordlines of the memory and the output lines are bitlines of the memory, or the input lines are bitlines of the memory and the output lines are wordlines of the memory.

The present disclosure provides a neural network computation method using adaptive data representation, adapted for a processor to perform multiply-and-accumulate (MAC) operations on a memory having a crossbar architecture. The memory comprises a plurality of input lines and a plurality of output lines crossing each other, a plurality of cells respectively disposed at intersections of the input lines and the output lines, and a plurality of sense amplifiers respectively connected to the output lines. In the method, a plurality of weight values to be respectively programmed into the cells are retrieved. A number of bits representing a low resistance state (LRS) in a binary representation of a target weight value among the weight values is counted. A plurality of candidate weight values around the target weight value are inquired to find one of the candidate weight values having a number of bits representing the LRS in a binary representation less than the counted number of bits by at least a rounding threshold. The found candidate weight value in replacement of the target weight value is programmed to the corresponding cell.

In an embodiment of the disclosure, the target weight value to the corresponding cell is programmed if no candidate weight value is found.

In an embodiment of the disclosure, in the step of inquiring a plurality of candidate weight values around the target weight value, a plurality of weight values having a difference from the target weight value less than or equal to a rounding distance are inquired as the candidate weight values.

The present disclosure provides a neural network computation apparatus using adaptive data representation comprises a memory and a processor. The memory comprises a plurality of input lines and a plurality of output lines crossing each other, a plurality of cells respectively disposed at intersections of the input lines and the output lines, and a plurality of sense amplifiers respectively connected to the output lines. The processor is coupled to the memory and configured to perform MAC operations comprising steps of: adaptively dividing an input cycle of kth bits respectively in a plurality of input data to be inputted to the input lines into a plurality of sub-cycles, wherein a number of the divided sub-cycles is determined according to a value of k and k is an integer; inputting the kth bits of the plurality of input data to the input lines with the sub-cycles and sensing computation results of the output lines by the sense amplifiers; and combining the computation results sensed in each sub-cycle to obtain a plurality of output data corresponding to the kth bits of the input data.

In an embodiment of the disclosure, the processor multiplies the output data corresponding to the bits of each order of the input data with corresponding exponential base and sums multiplication results of the bits of all orders to obtain a final output data.

In an embodiment of the disclosure, the processor increases the number of the divided sub-cycles as the value of k increases and determines a maximum number of the input lines involved in each of the divided sub-cycles according to a resolution of the sense amplifiers.

In an embodiment of the disclosure, the processor further comprises: retrieving a plurality of weight values to be respectively programmed into the cells; counting a number of bits representing a low resistance state (LRS) in a binary representation of a target weight value among the weight values; inquiring a plurality of candidate weight values around the target weight value to find one of the candidate weight values having a number of bits representing the LRS in a binary representation less than the counted number of bits by at least a rounding threshold; and programming the found candidate weight value in replacement of the target weight value to the corresponding cell.

In an embodiment of the disclosure, the processor comprises programming the target weight value to the corresponding cell if no candidate weight value is found.

In an embodiment of the disclosure, the processor comprises inquiring a plurality of weight values having a difference from the target weight value less than or equal to a rounding distance as the candidate weight values.

In an embodiment of the disclosure, a number of the divided sub-cycles for most significant bits (MSBs) in the input data is larger than a number of the divided sub-cycles for least significant bits (LSBs) in the input data.

In an embodiment of the disclosure, the memory comprises NAND flash, NOR flash, phase change memory (PCM), spin-transfer torque random-access memory (STT-RAM), or resistive random-access memory (ReRAM) of 2D or 3D structure.

In order to make the aforementioned features and advantages of the disclosure more comprehensible, embodiments accompanying figures are described in detail below.

DESCRIPTION OF EMBODIMENTS

Due to the resistance programming variation, the accumulated currents induced by MAC operations for different values are probably converted to the same value. Thus, the crossbar accelerator suffers from the overlapping variation error while it converts the accumulated currents to a digital output in each MAC operation. The overlapping variation error is that some accumulated currents are converted to an incorrect digital value during the analog to digital conversion step, because more than one possible digital values are mapped to the same accumulated current. It is noted that the magnitude of the accumulated current is only influenced by input lines supplied with input voltage. Thus, "valid input line" is defined as the input lines with input voltage during a MAC operation.

Figure 1:
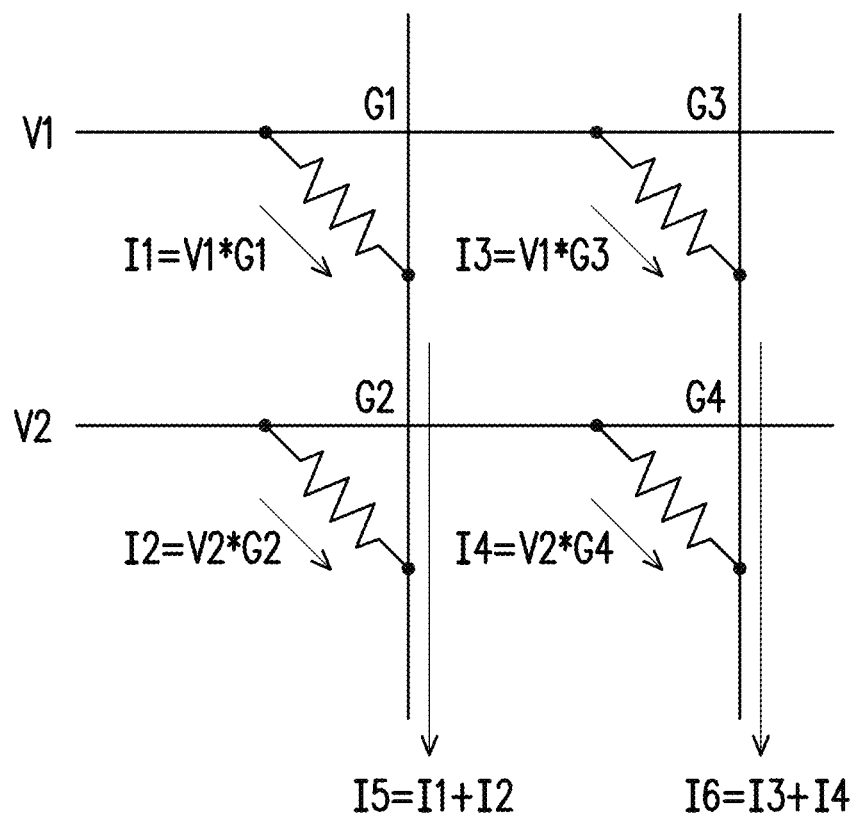
FIG. 1 shows an example of performing the computation of MAC operations by using a crossbar accelerator.
Figure 2A:
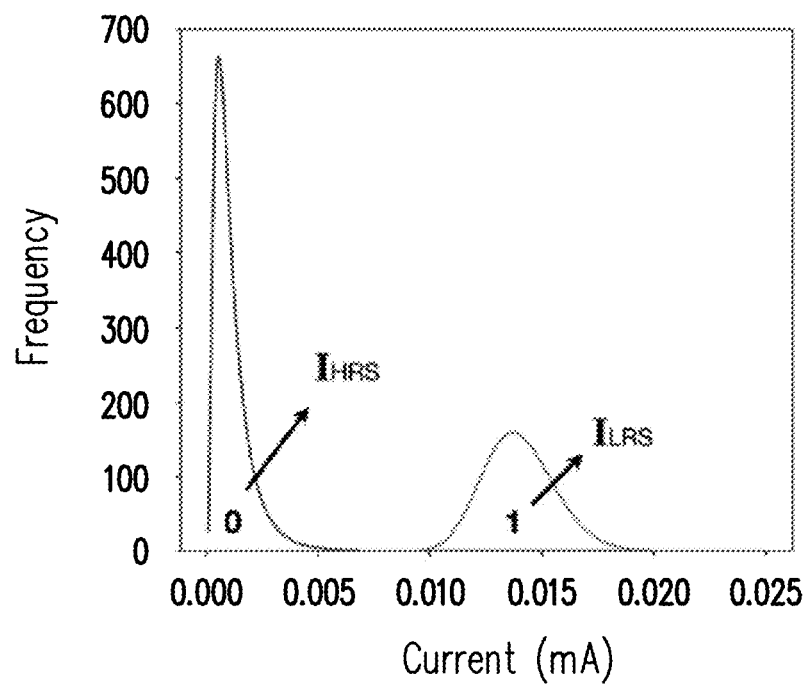
FIG. 2A shows the distribution of the output current for all ReRAM cells by applying an identical voltage to program all cells in a ReRAM chip to the low resistance state (LRS) and high resistance state (HRS).

FIG. 2A shows the distribution of the output current for all ReRAM cells by applying an identical voltage to program all cells in a ReRAM chip to the low resistance state (LRS) and high resistance state (HRS). When a predefined voltage (e.g., 0.3V) is applied to the input lines whose corresponding input bit values are "1", the possible distribution of the output current for all ReRAM cells is as shown in FIG. 2A. The x-axis of FIG. 2A denotes the current and the y-axis denotes the frequency.

Figure 2B:
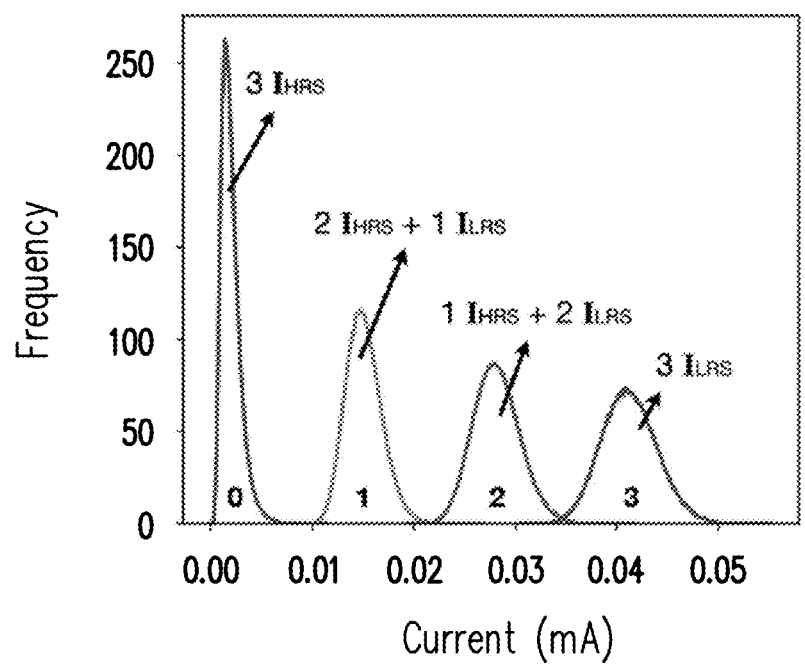
FIG. 2B to FIG. 2D illustrate the challenge of a crossbar accelerator on converting the accumulated currents, especially when more valid wordlines are involved.
Figure 2C:
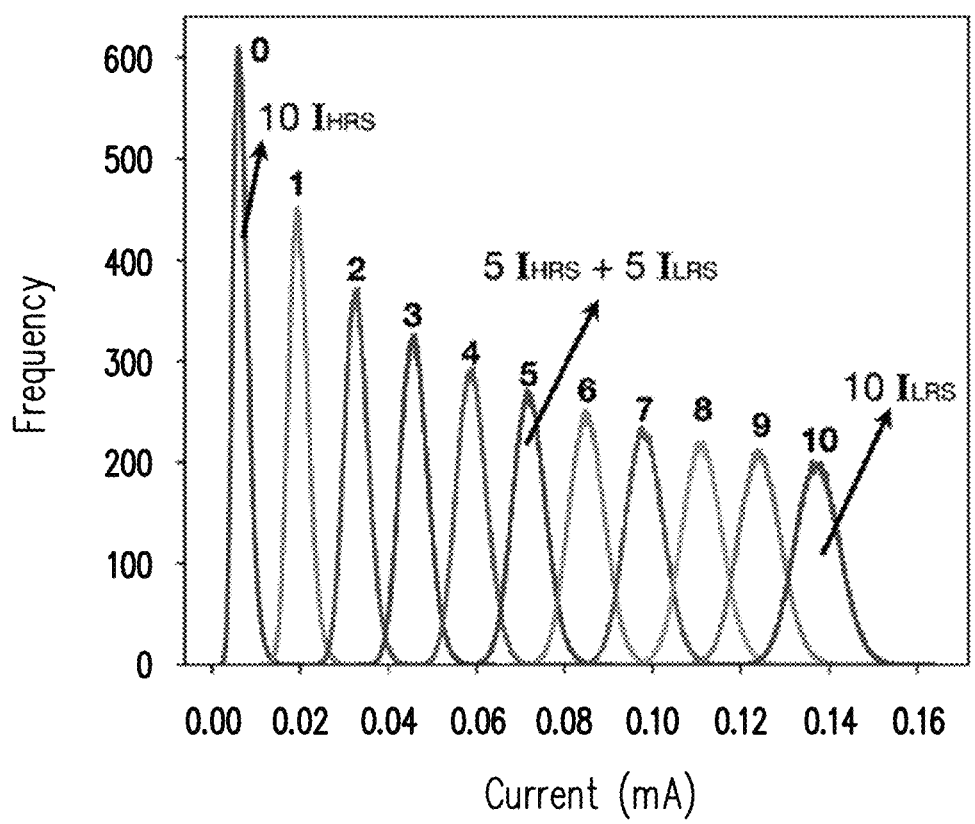
Figure 2D:
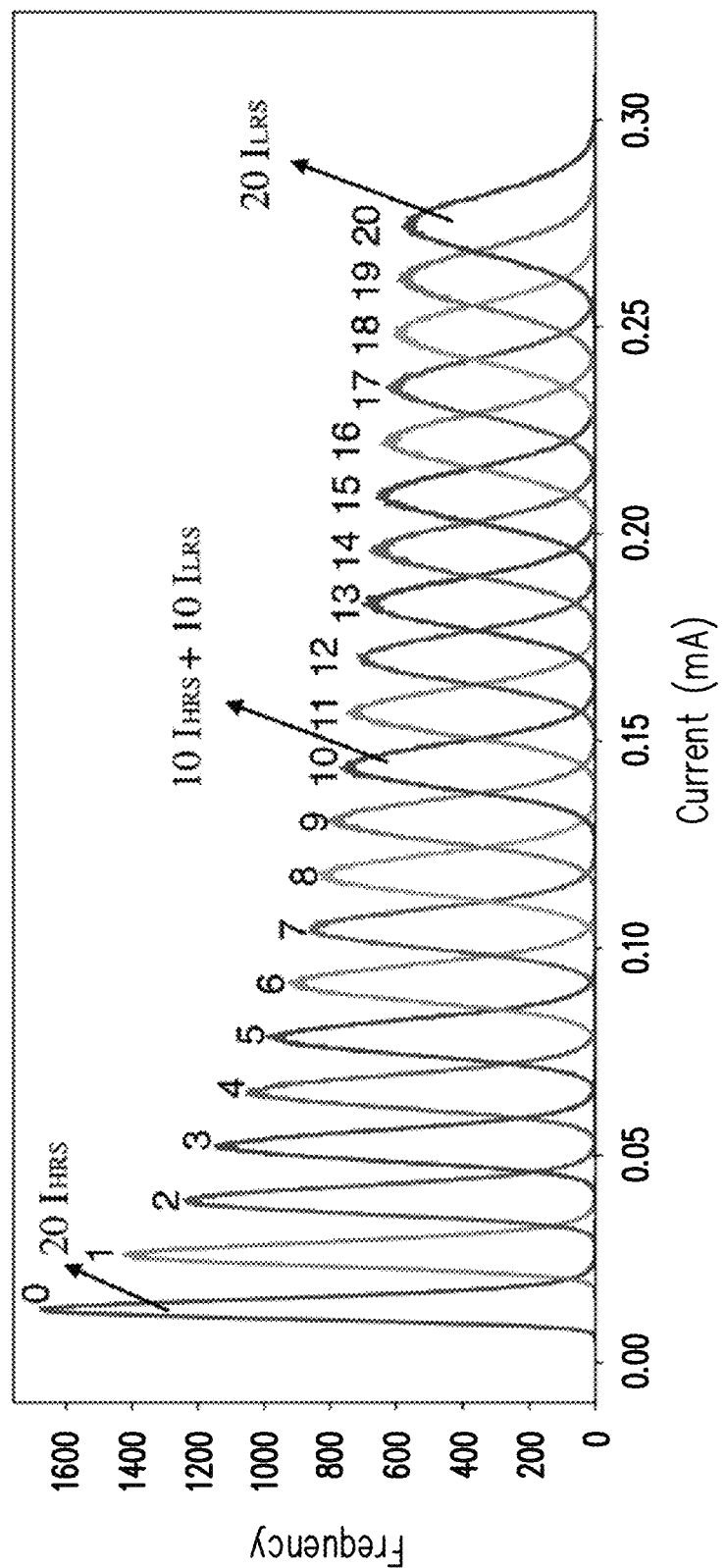

FIG. 2B to FIG. 2D illustrate the challenge of a crossbar accelerator on converting the accumulated currents, especially when more valid input lines are involved. FIG. 2B illustrates four possible cases incurred by three valid input lines and their corresponding digital values. The x-axis of FIG. 2B denotes the current and the y-axis denotes the frequency. These four cases (i.e., $3I_{HRS}$, $2I_{HRS}+1I_{LRS}$, $1IHRS+2I_{HRS}$ and $3I_{LRS}$) may induce accumulated current within four ranges (i.e., 0.00-0.01 mA, 0.01-0.02 mA, 0.02-0.35 mA, and 0.034-0.05 mA), and will be converted into four digital outputs (i.e., 0, 1, 2 and 3), respectively. It is noted that, the overlapping variation error occurs when the accumulated current is, for example, around 0.034 mA and will be ambiguously converted to digital value either 2 or 3.

The probability of the overlapping variation error becomes higher when more valid input lines are involved in the MAC operation. FIG. 2C shows the probability of the overlapping variation error of 10 valid input lines while FIG. 2D shows the probability of the overlapping variation error of 20 valid input lines. It is noted that the probability of the overlapping variation error grows dramatically as more valid input lines are involved.

In the embodiment of the present disclosure, an adaptive data representation strategy is proposed to transform both inputs and weights with exploiting the property of data representation, so as to significantly reduce the occurrence of the overlapping variation error. Besides, the transformation is an offline strategy without incurring any runtime overhead. The proposed strategy includes two policies, i.e., Adaptive Input Sub-cycling Policy (AISP) and Weight Rounding Policy (WRP), where AISP focuses on the data representation of inputs and WRP focuses on the data representation of model weights.

AISP trades the accuracy and performance in different input cycles to (1) minimize the overlapping variation error on the cycles for the most significant bits (MSBs) and (2) boost the performance during the cycles for the least significant bits (LSBs).

WRP performs approximate transformation on all weights in the given neural network (NN) model and returns an approximating NN model with low overlapping variation errors. It is noted that both policies are designed to decrease the occurrence/probability of the overlapping variation error in different aspects (i.e., inputs and model weights) and can achieve better accuracy when they are applied together.

Figure 3:
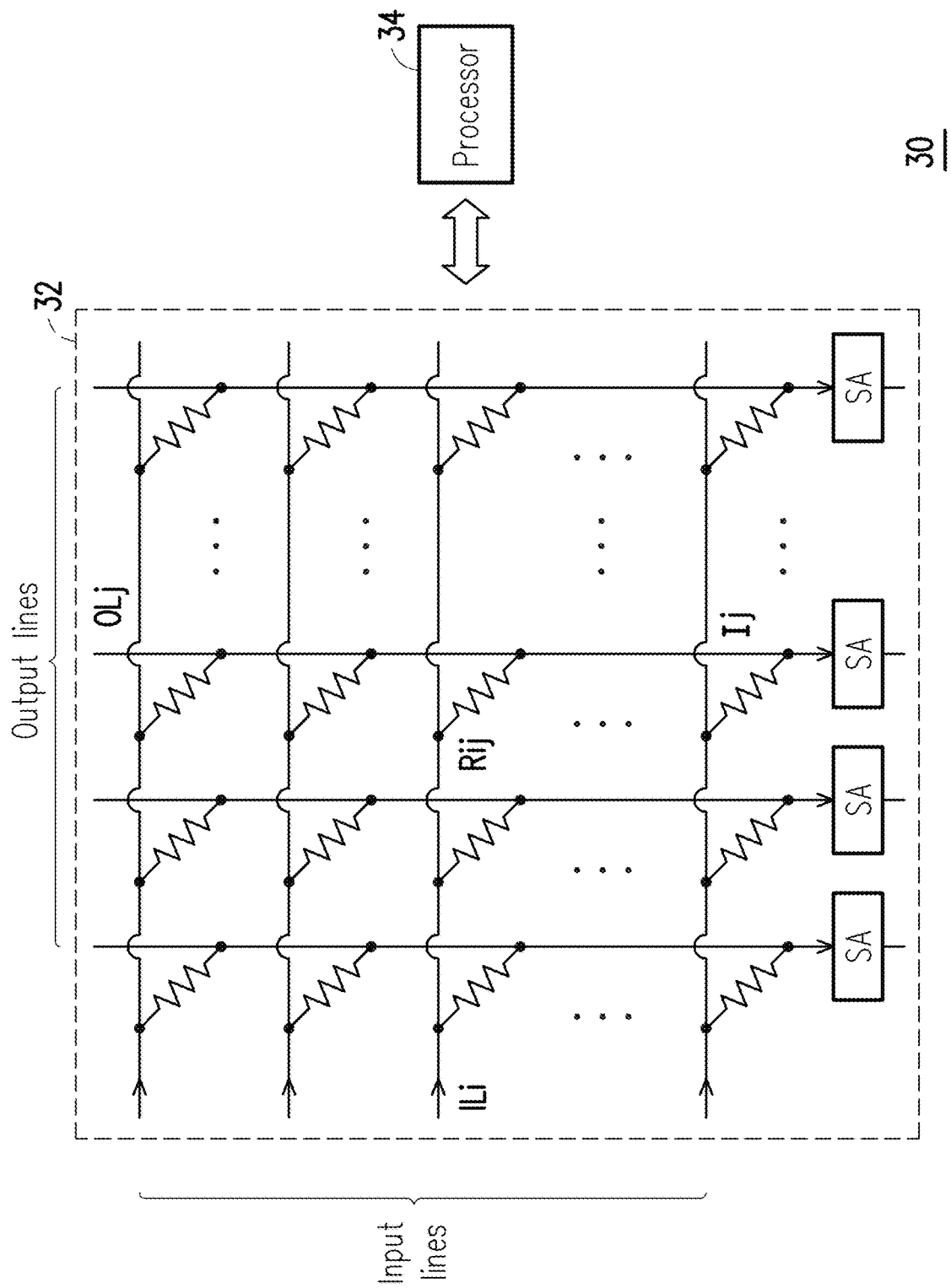
FIG. 3 is a schematic diagram of a neural network computation apparatus using adaptive data representation according to an embodiment of the disclosure.

FIG. 3 is a schematic diagram of a neural network computation apparatus using adaptive data representation according to an embodiment of the disclosure. Referring to FIG. 3, the neural network computation apparatus 30 of the embodiment is, for example, a crossbar accelerator for neural network computation, and is configured to realize process-in-memory (PIM) so as to eliminate the data movement between computation and memory cells. The neural network computation apparatus 30 comprises a memory 32 and a processor 34.

The memory 32 is, for example, NAND flash, NOR flash, phase change memory (PCM), spin-transfer torque random-access memory (STT-RAM), or resistive random-access memory (ReRAM) of 2D or 3D structure, which is not limited herein. The memory 32 comprises a plurality of input lines $IL_i$ and a plurality of output lines $OL_j$ crossing each other, a plurality of cells (represented by its resistance $R_{ij}$) respectively disposed at intersections of the input lines $IL_i$ and the output lines $OL_j$, and a plurality of sense amplifiers SA respectively connected to the output lines $OL_j$. In some embodiments, the input lines $IL_i$ are wordlines while the output lines $OL_j$ are bitlines, and in some embodiments, the input lines $IL_i$ are bitlines while the output lines $OL_j$ are wordlines, which is not limited herein.

The processor 34 is, for example, a central processing unit (CPU), or other programmable general-purpose or specific-purpose microprocessor, microcontroller (MCU), programmable controller, application specific integrated circuits (ASIC), programmable logic device (PLD) or other similar devices or a combination of these devices; the embodiment provides no limitation thereto. In the present embodiment, the processor 34 is configured to execute instructions for performing the neural network computation method as described below.

[Adaptive Input Sub-Cycling Policy (AISP)]

Current crossbar accelerators perform an operation by setting voltages on all the wordlines (i.e., 128) simultaneously in one cycle. However, based on the experimental results as presented in FIG. 2(d), it incurs unacceptable probability of the overlapping variation error while performing operations on merely 20 valid wordlines in a cycle. Thus, in the present disclosure, it is proposed to divide an input cycle into several sub-cycles, each of which is a basic computation unit, so that the overlapping variation error can be directly relieved.

For example, if an input cycle involves n wordlines and each sub-cycle involves m wordlines at a time, it needs at most n/m sub-cycles to complete this input cycle. As a value of m decreases, the probability of the overlapping variation error can be reduced but the total execution time may be increased. Moreover, the magnitude of the overlapping variation error incurred in different cycles has different impact on the final accuracy of the crossbar accelerators. Specifically, according to the 2's complement data representation, the magnitude of the error induced by each input cycle, which implies the order of the exponential part, is magnified by the corresponding exponent power. Thus, the magnitude of the error induced by most significant bits (MSBs) is severer than that induced by least significant bits (LSBs).

To be aware of the error magnification incurred by different input cycles, in the present disclosure, a neural network computation method is proposed to adaptively divide each input cycle according to the corresponding bit orders/positions. That is, the ith input cycle will be divided into sub-cycles with $m_i$ wordlines. Since the cycles for MSBs are error sensitive but the cycles for LSBs are not sensitive, the method minimizes the magnitude of error during the cycles for MSBs and boosting the performance during the cycles for LSBs. Specifically, for the input cycles with respect to the bits located closer to the MSB, each of the divided sub-cycles involves fewer wordlines so as to reduce the probability of the overlapping variation error, and for the input cycles with respect to the bits located closer to the LSB, each of the divided sub-cycles involves greater wordlines so as to reduce the total execution time.

Figure 4:
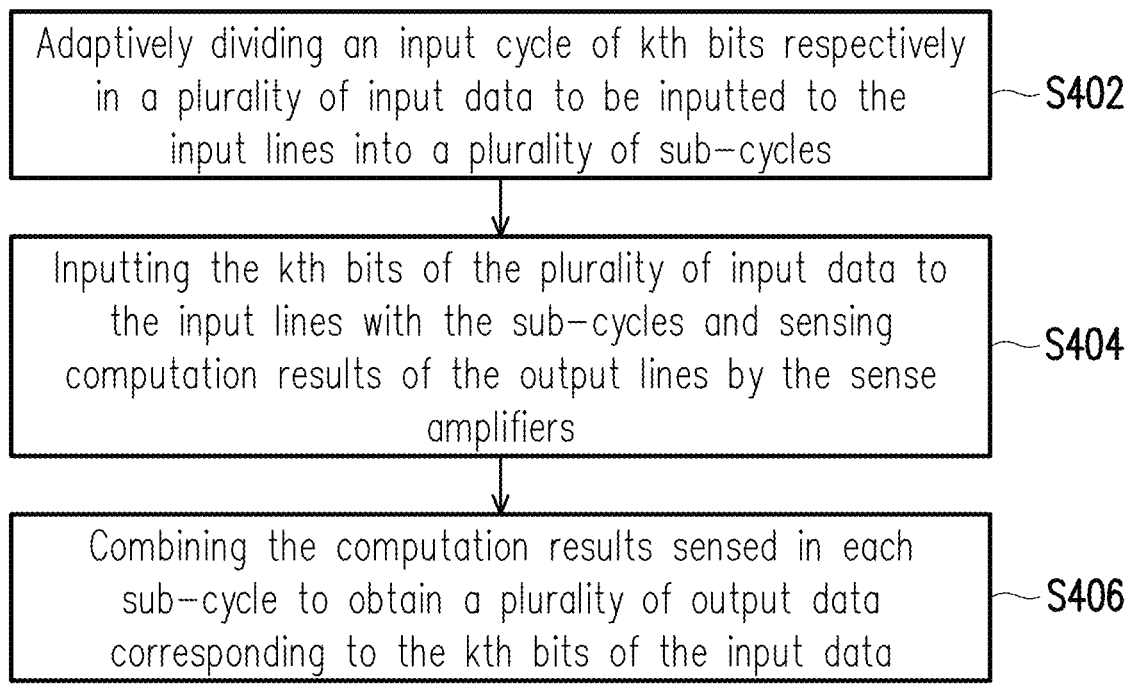
FIG. 4 is a flow chart of neural network computation method using adaptive data representation according to an embodiment of the disclosure.

In detail, FIG. 4 is a flow chart of neural network computation method using adaptive data representation according to an embodiment of the disclosure. Referring to FIG. 3 and FIG. 4, the method of the present embodiment is adaptable for the above-mentioned neural network computation apparatus 30, and the detailed steps of the neural network computation method of the present embodiment will be described below with reference to the various devices and components of the neural network computation apparatus 30.

First, in step S402, the processor 34 adaptively divides an input cycle of kth bits respectively in a plurality of input data to be inputted to the input lines into a plurality of sub-cycles, wherein a number of the divided sub-cycles is determined according to a value of k and k is an integer. In one embodiment, the processor 34 increases the number of the divided sub-cycles as the value of k increases and determines a maximum number of the input lines involved in each of the divided sub-cycles according to a resolution of the sense amplifiers. That is, as the value of k increases, the bits to be inputted are located closer to the MSB which means the bits are relatively significant bits, and thus, the number of the divided sub-cycles is increased to increase the computation accuracy. On the contrary, as the value of k decreases, the bits to be inputted are located closer to the LSB which means the bits are less significant, and thus, the number of the divided sub-cycles is decreased to save the computation time. Specifically, a number of the divided sub-cycles for MSBs in the input data is larger than a number of the divided sub-cycles for LSBs in the input data. It is noted the number of states that can be recognized by the sense amplifiers is limited by the resolution of the sense amplifiers, and accordingly the number of the input lines involved in each of the divided sub-cycles is also limited.

Then, in step S404, the processor 34 inputs the kth bits of the plurality of input data to the input lines with the sub-cycles and senses computation results of the output lines by the sense amplifiers SA, and in step S406, the processor 34 combines the computation results sensed in each sub-cycle to obtain a plurality of output data corresponding to the kth bits of the input data.

It is noted that after obtaining the output data corresponding to the bits of each order of the input data, the processor 34 further multiplies the output data corresponding to the bits of each order of the input data with corresponding exponential part and sums multiplication results of the bits of all orders to obtain a final output data.

Figure 5A:
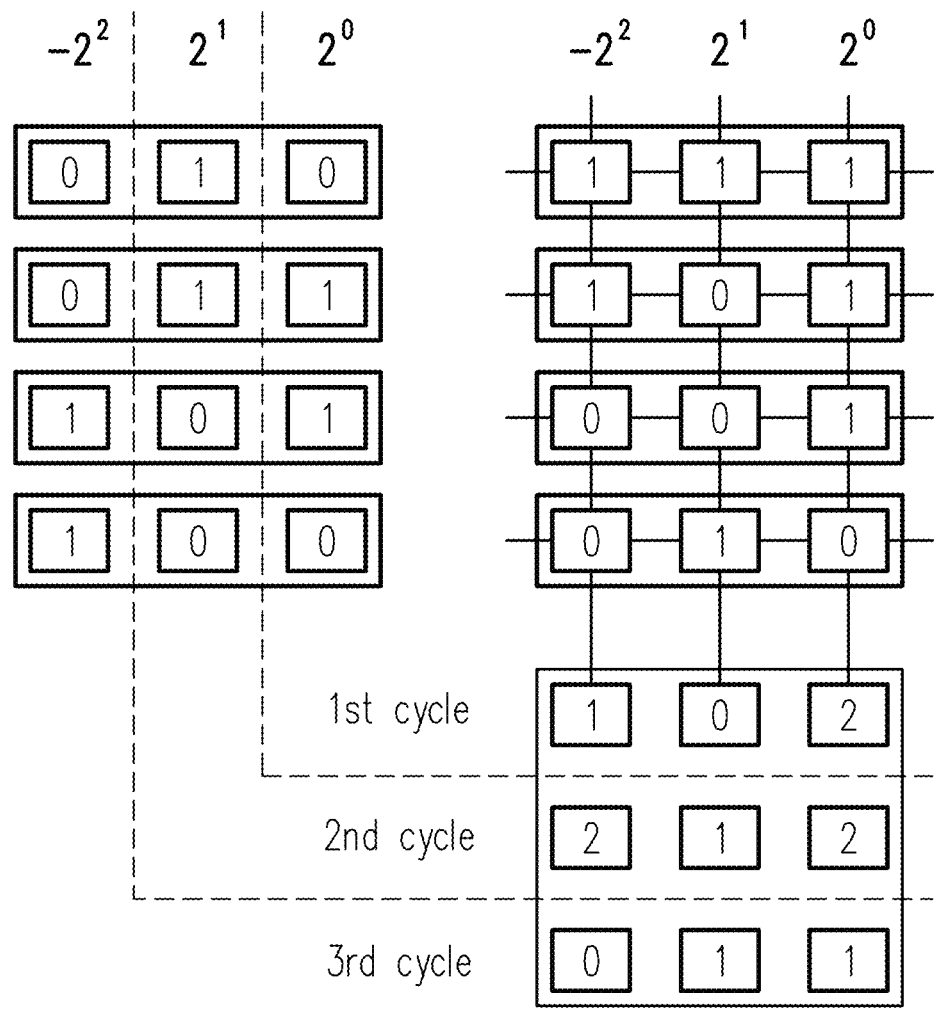
FIG. 5A shows an example of performing MAC operations on inputs and weights represented by 3-bit values through the crossbar accelerator.

FIG. 5A shows an example of performing MAC operations on inputs and weights represented by 3-bit values through the crossbar accelerator. The crossbar accelerator transforms values of the inputs [2, 3, −3, −4] and weights [−1, −3, 1, 2] into 3-bit signed fixed point values and then feeds the transformed input bits cycle by cycle. The result of the 1st cycle is $(1\times(-2^2)+0\times2^1+2\times2^0)\times2^0=-2$, the 2nd cycle is $(2\times(-2^2)+1\times2^1+2\times2^0)\times2^1=-8$, and the 3rd cycle is $(0\times(-2^2)+1\times2^1+1\times2^0)\times(-2^2)=-12$. After that, the crossbar accelerator merges the output of all cycles to get the final result, that is, $(-2)+(-8)+(-12)=-22$.

Figure 5B:
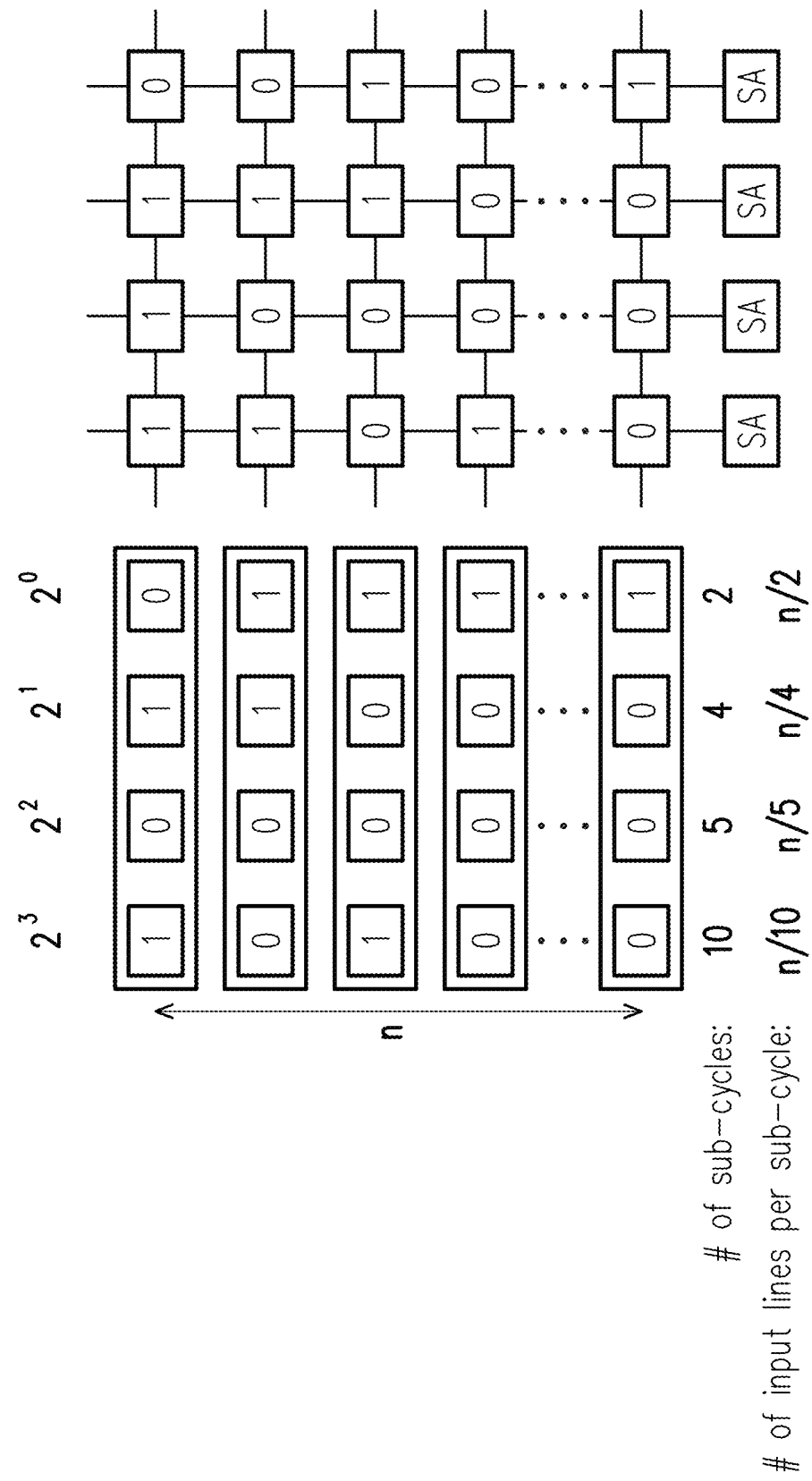
FIG. 5B shows an example of performing MAC operations inputs and weights represented by 4-bit values with sub-cycles through the crossbar accelerator according to an embodiment of the disclosure.

FIG. 5B shows an example of performing MAC operations inputs and weights represented by 4-bit values with sub-cycles through the crossbar accelerator according to an embodiment of the disclosure. The crossbar accelerator transforms values of the inputs [10, 3, 9, 1, . . . , 1] and weights [14, 10, 3, 8, . . . , 1] into 4-bit signed fixed point values and then feeds the transformed input bits. It is noted that, instead of performing the MAC operation on all the wordlines simultaneously in one cycle as exemplified in FIG. 5A, in FIG. 5B, an input cycle of the bits of each order is divided into multiple sub-cycles according to the order of the bits. For example, an input cycle of the $0^{th}$ bits (i.e. the LSB) is divided into 2 sub-cycles and a number of input lines involved in each sub-cycle is n/2 where n represents a total number of the input lines. An input cycle of the $1^{st}$ bits is divided into 4 sub-cycles and a number of input lines involved in each sub-cycle is n/4. An input cycle of the $2^{nd}$ bits is divided into 5 sub-cycles and a number of input lines involved in each sub-cycle is n/5. An input cycle of the $3^{rd}$ bit (i.e. the MSB) is divided into 10 sub-cycles and a number of input lines involved in each sub-cycle is n/10. Accordingly, assuming the total number n of the input lines is 20, the number of input lines involved in the computation of the $0^{th}$, $1^{st}$, $2^{nd}$, $3^{rd}$ bits in each sub-cycle are 10, 5, 4 and 2, respectively. The result of each cycle is multiplied with its exponential part (i.e., $2^0$, $2^1$, $2^2$ and $2^3$) to obtain a final computation result.

Through the method described above, the calculation time for the bits of lower order can be saved through fewer sub-cycles (e.g. 2 cycles for $0^{th}$ bits) and the saved time can be used for the calculation of the bits of higher order through greater sub-cycles (e.g. 10 cycles for $3^{rd}$ bits). Accordingly, the overlapping variation error can be reduced.

[Weight Rounding Policy (WRP)]

It is noted that the probability of the overlapping variation error is proportional to the number of the cells (e.g. ReRAM cells) programmed in the low resistance state (LRS) in each sub-cycle, as show in FIG. 2A to FIG. 2D. The reason is that, according to Ohm's law, the current value is inversely proportional to the resistance value under the same input voltage. Thus, compared with the high resistance state (HRS), possible current values induced by the cells in the LRS are greater and will cover a wider range. Thus, as shown in FIG. 2A to FIG. 2D, the current distribution becomes wider while more cells in the LRS are involved; and wider distribution overlaps with neighbor distributions, so that the overlapping distribution increases the error rates for the analog to digital conversion.

For running DNN with crossbar accelerators, model weight values are decomposed to a series of binary bits and each cell representing a bit value of "1" is programmed to the LRS. On the other hand, DNN is known as an approximate computing technique. Its accuracy may not be affected seriously when its weight values only have small deviations. Thus, slightly modifying model weight values may not seriously impact the overall accuracy.

To relieve the overlapping distribution issue incurred by cells in the LRS, a Weight Rounding Policy (WRP) is proposed in the disclosure to transform the original weight values to their neighbor values with fewer 1's. For example, the crossbar accelerator transforms a weight value of "255" represented by 0b011111111 in binary, to a weight value of "256" represented by 0b100000000 in binary, which has fewer 1's. In one embodiment, a number of bits representing the LRS in a binary representation of each weight value is maximized to reduce the overlapping variation error within limited impact on the model accuracy.

Figure 6:
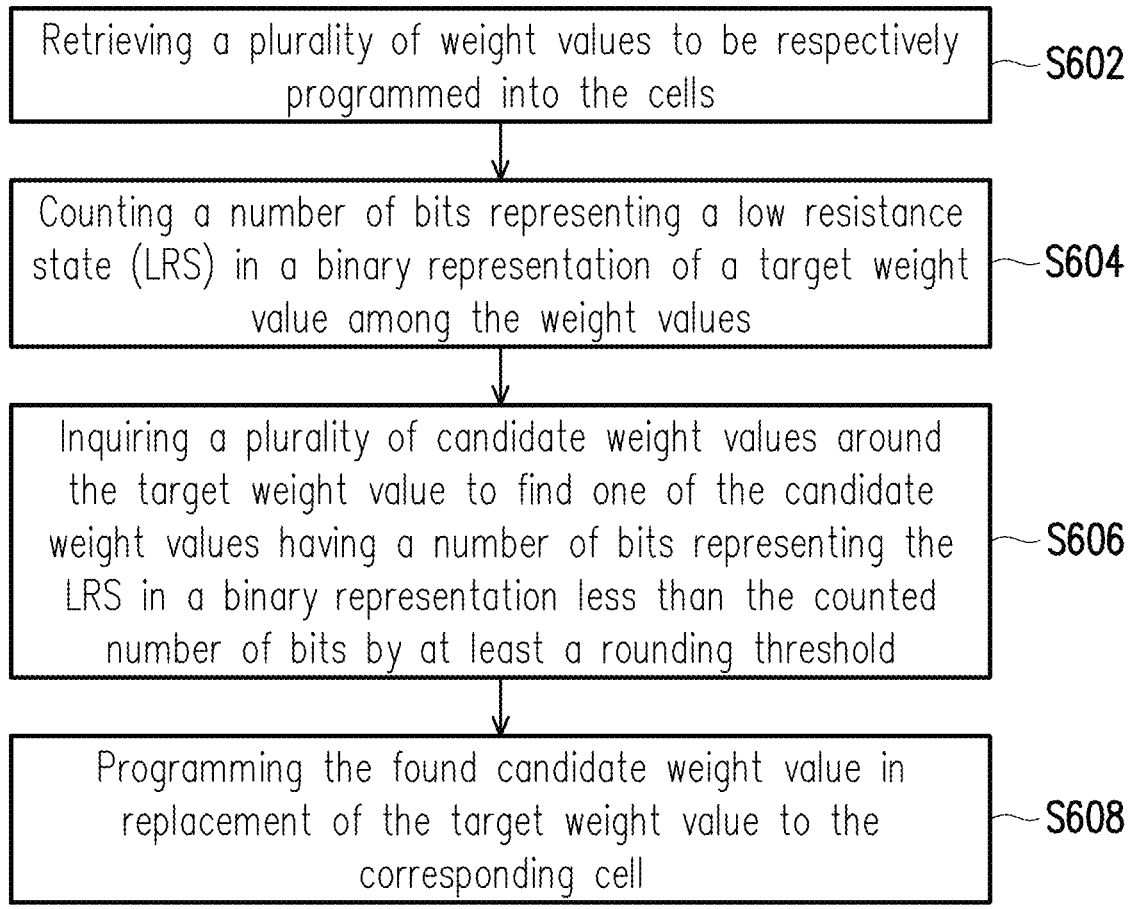
FIG. 6 is a flow chart of neural network computation method using adaptive data representation according to an embodiment of the disclosure.

In detail, FIG. 6 is a flow chart of neural network computation method using adaptive data representation according to an embodiment of the disclosure. Referring to FIG. 3 and FIG. 6, the method of the present embodiment is adaptable for the above-mentioned neural network computation apparatus 30, and the detailed steps of the neural network computation method of the present embodiment will be described below with reference to the various devices and components of the neural network computation apparatus 30.

First, in step S602, the processor 34 retrieves a plurality of weight values to be respectively programmed into the cells.

In step S604, the processor 34 counts a number of bits representing a low resistance state (LRS) in a binary representation of a target weight value among the weight values.

In step S606, the processor 34 inquires a plurality of candidate weight values around the target weight value to find one of the candidate weight values having a number of bits representing the LRS in a binary representation less than the counted number of bits by at least a rounding threshold, in which the round threshold is set as, for example, an integer between 2 and 4, but the disclosure is not limited thereto. In one embodiment, the processor 34 may inquires a plurality of weight values having a difference from the target weight value less than or equal to a rounding distance as the candidate weight values.

In detail, in the present embodiment, two main parameters for fine grained tuning are provided. The parameters are rounding distance (K) and minimum rounding gain (G). The rounding distance implies the maximum rounding range for all weight values and the minimum rounding gain provides a minimum bound to avoid weights to be rounded with insufficient gain regarding the total number of cells in the LRS.

Assuming there are a predefined rounding distance K and a minimum rounding gain g, and given a weight value Ws, the processor 34 aims to pick up a weight value Wt represented with the fewest number of 1's and satisfied with two conditions as follows. It is noted that $B_{LRS}$ is a function to count the number of bits in the LRS after applying the binary representation.

$$|W_s - W_t| \leq K \quad (1)$$

$$B_{LRS}(W_s) - B_{LRS}(W_t) \geq g \quad (2)$$

The recommended configuration selection is to pick up a larger K with a proper g under an acceptable model accuracy. That is because, according to condition (1), a larger K provides greater probability to perform rounding for all weights so as to improve the efficiency for WRP. On the other hand, a proper g is to limit the degradation of model accuracy by reducing the total amount of weight rounding.

Figure 7A:
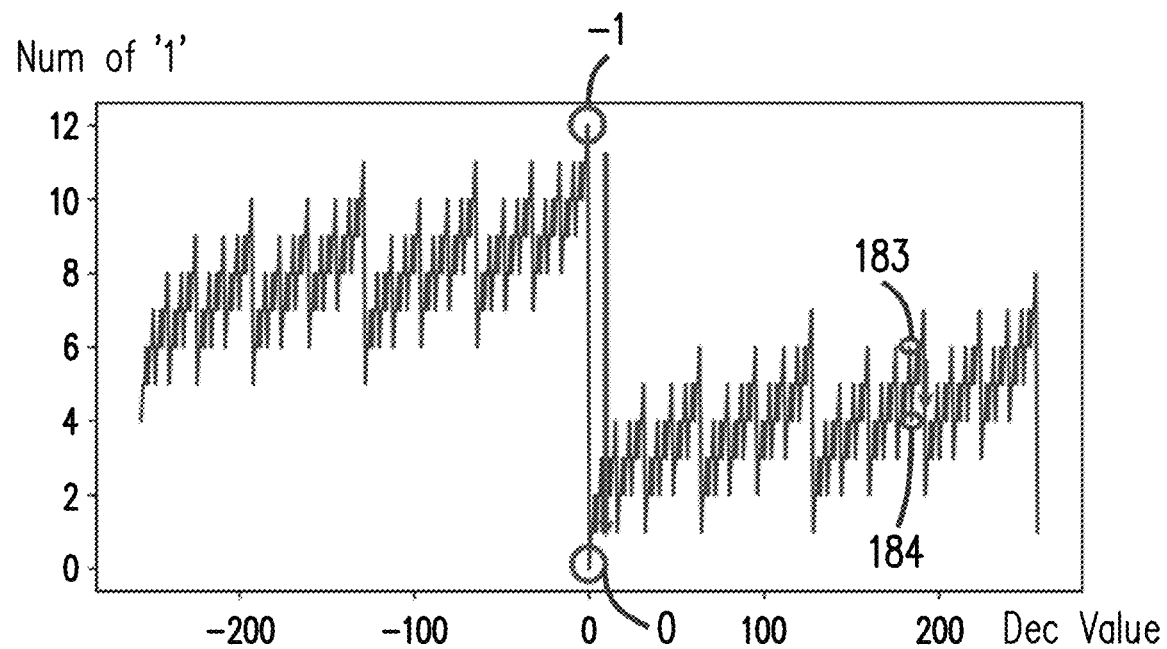
FIG. 7A and FIG. 7B are examples illustrating the weight rounding policy (WRP) according to an embodiment of the disclosure.
Figure 7B:
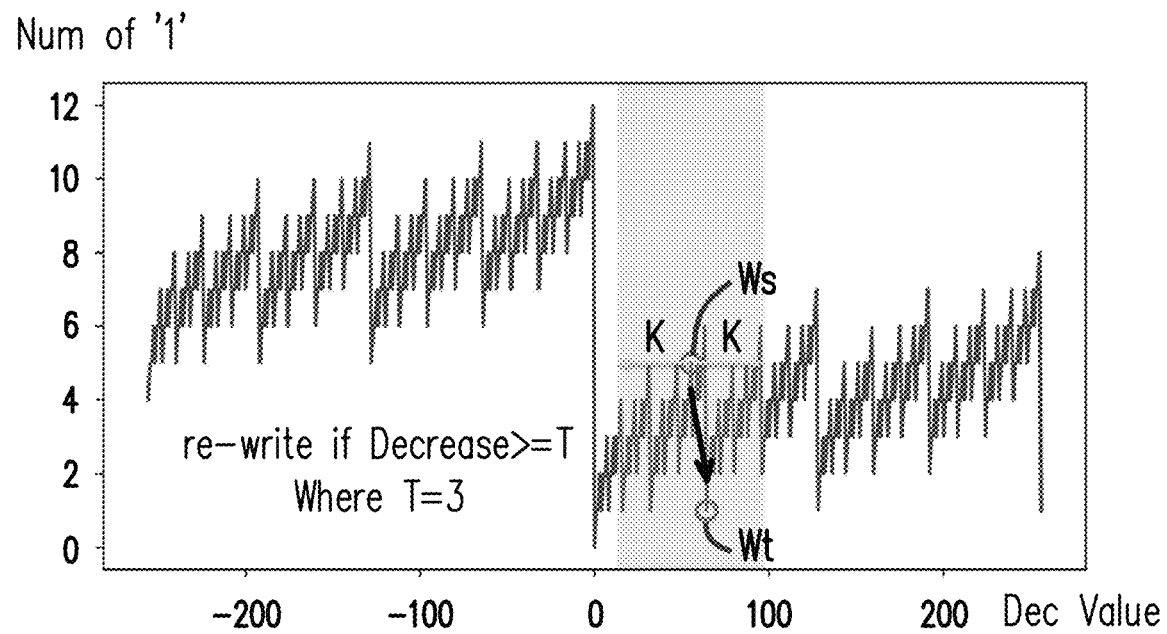

For example, FIG. 7A and FIG. 7B are examples illustrating the weight rounding policy (WRP) according to an embodiment of the disclosure. Referring to FIG. 7A, a weight value of "−1" represented by 111111111111 in binary is rounded to a weight value of "0" represented by 000000000000 in binary, which has fewer 1's. A weight value of "183" represented by 000010110111 in binary is rounded to a weight value of "184" represented by 000010111000 in binary, which has fewer 1's. Referring to FIG. 7B, for a given weight value Ws, a rounding distance K is given to define a range around the weight value Ws for inquiring the candidate weight values, and a threshold value T is given to determine whether the candidate weight value being found can be used to re-write the original weight value. In the present embodiment, the threshold value T is set as 3 and therefore if a weight value Wt having a number of bits "1" in a binary representation is less than the number of bits of "1" of the weight value Ws by at least 3, the weight value Wt is selected to be programmed to the corresponding cell in replacement of the weight value Ws.

It is noted that the impact on model accuracy is unpredictable while setting different values of g with the same K. That is, the inference result of DNN is decided by comparing all the values in a low dimensional output vector generated by a series of high dimensional model multiplications, and thus it is hard to predict the impact on the final output while applying the WRP with different configurations to each model. Accordingly, an offline analysis may be used for each DNN model. That is, a proper configuration of both K and g for different DNN models can be tuned at the sever side beforehand; after that, DNN models are transformed by selecting configuration on the server before being sent to the crossbar accelerator. It is noted that WRP can be implemented by checking look-up tables, and the optimal transformation regarding the total number of LRS bits for each weight value under different rounding distance and minimum rounding gain can be maintained in a look-up table in the server.

That is, in one embodiment, a look-up table can be previously established through an offline analysis, in which the candidate weight value having a number of bits representing the LRS in a binary representation less than a number of bits of an arbitrary weight value by at least a rounding threshold is recorded. As such, the processor 34 may find the candidate weight value used for replacing the target weight value by looking up the look-up table.

Finally, in step S608, the processor 34 programs the found candidate weight value in replacement of the target weight value to the corresponding cell, in which, if no candidate weight value is found, the processor 34 programs the target weight value to the corresponding cell.

Through the method described above, decreasing of overlapping variation error can be maximized with limited impact on the model accuracy.

In summary, in the method and the apparatus for neural network computation using adaptive data representation provided in the embodiments of the present disclosure, the inputs and weights used for neural network computation are transformed into binary representation with exploiting the property of digital data such that the analog variation error can be relieved. The method and the apparatus could also be applied to all systems that contain devices designed to run on resource-constrained devices like IOT devices to perform binary convolutional neural networks (BCNN), but the disclosure is not limited thereto.

Although the disclosure has been disclosed by the above embodiments, the embodiments are not intended to limit the disclosure. It will be apparent to those skilled in the art that various modifications and variations can be made to the structure of the disclosure without departing from the scope or spirit of the disclosure. Therefore, the protecting range of the disclosure falls in the appended claims.

What is claimed is:

1. A neural network computation method using adaptive data representation, adapted for a processor to perform multiply-and-accumulate (MAC) operations on a memory having a crossbar architecture, wherein the memory comprises a plurality of input lines and a plurality of output lines crossing each other, a plurality of cells respectively disposed at intersections of the input lines and the output lines, and a plurality of sense amplifiers respectively connected to the output lines, the method comprising:

adaptively dividing an input cycle of kth bits respectively in a plurality of input data to be inputted to the input lines into a plurality of sub-cycles, wherein a number of the divided sub-cycles is determined according to a value of k and k is an integer;

inputting the kth bits of the plurality of input data to the input lines with the sub-cycles and sensing computation results of the output lines by the sense amplifiers; and combining the computation results sensed in each sub-cycle to obtain a plurality of output data corresponding to the kth bits of the input data.

2. The method of claim 1, further comprising:
multiplying the output data corresponding to the bits of each order of the input data with corresponding exponential base and summing multiplication results of the bits of all orders to obtain a final output data.

3. The method of claim 1, wherein the number of the divided sub-cycles increases as the value of k increases and a maximum number of the input lines involved in each of the divided sub-cycles is determined according to a resolution of the sense amplifiers.

4. The method of claim 1, wherein a number of the divided sub-cycles for most significant bits (MSBs) in the input data is larger than a number of the divided sub-cycles for least significant bits (LSBs) in the input data.

5. The method of claim 1, wherein the memory comprises NAND flash, NOR flash, phase change memory (PCM), spin-transfer torque random-access memory (STT-RAM), or resistive random-access memory (ReRAM) of 2D or 3D structure.

6. The method of claim 1, wherein the input lines are wordlines of the memory and the output lines are bitlines of the memory, or the input lines are bitlines of the memory and the output lines are wordlines of the memory.

7. A neural network computation apparatus using adaptive data representation, comprising:
a memory having a crossbar architecture, comprising:
a plurality of input lines and a plurality of output lines crossing each other;
a plurality of cells respectively disposed at intersections of the input lines and the output lines; and
a plurality of sense amplifiers respectively connected to the output lines;
a processor, coupled to the memory and configured to perform MAC operations comprising steps of:
adaptively dividing an input cycle of kth bits respectively in a plurality of input data to be inputted to the input lines into a plurality of sub-cycles, wherein a number of the divided sub-cycles is determined according to a value of k and k is an integer;
inputting the kth bits of the plurality of input data to the input lines with the sub-cycles and sensing computation results of the output lines by the sense amplifiers; and
combining the computation results sensed in each sub-cycle to obtain a plurality of output data corresponding to the kth bits of the input data.

8. The neural network computation apparatus of claim 7, wherein the processor multiplies the output data corresponding to the bits of each order of the input data with corresponding exponential base and sums multiplication results of the bits of all orders to obtain a final output data.

9. The neural network computation apparatus of claim 7, wherein the processor increases the number of the divided sub-cycles as the value of k increases and determines a maximum number of the input lines involved in each of the divided sub-cycles according to a resolution of the sense amplifiers.

10. The neural network computation apparatus of claim 7, wherein a number of the divided sub-cycles for MSBs in the input data is larger than a number of the divided sub-cycles for LSBs in the input data.

11. The neural network computation apparatus of claim 7, wherein the processors further comprises:
retrieving a plurality of weight values to be respectively programmed into the cells;
counting a number of bits representing a low resistance state (LRS) in a binary representation of a target weight value among the weight values;
inquiring a plurality of candidate weight values around the target weight value to find one of the candidate weight values having a number of bits representing the LRS in a binary representation less than the counted number of bits by at least a rounding threshold; and
programming the found candidate weight value in replacement of the target weight value to the corresponding cell.

12. The neural network computation apparatus of claim 11, wherein the processors comprises programming the target weight value to the corresponding cell if no candidate weight value is found.

13. The neural network computation apparatus of claim 11, wherein the processors comprises inquiring a plurality of weight values having a difference from the target weight value less than or equal to a rounding distance as the candidate weight values.

14. The neural network computation apparatus of claim 7, wherein the memory comprises NAND flash, NOR flash, PCM, STT-RAM, or ReRAM of 2D or 3D structure.

15. The neural network computation apparatus of claim 7, wherein the input lines are wordlines of the memory and the output lines are bitlines of the memory, or the input lines are bitlines of the memory and the output lines are wordlines of the memory.

* * * * *